United States Patent [19]
Monkowski et al.

[11] Patent Number: 6,071,767
[45] Date of Patent: Jun. 6, 2000

[54] HIGH PERFORMANCE/HIGH DENSITY BICMOS PROCESS

[75] Inventors: Michael Monkowski, New Windsor; Seiki Ogura, Hopewell Junction; Nivo Rovedo, Lagrangeville; Joseph Francis Shepard, Hopewell Junction, all of N.Y.

[73] Assignee: International Business Machines Corporation, Armonk, N.Y.

[21] Appl. No.: 07/900,528

[22] Filed: Jun. 17, 1992

Related U.S. Application Data

[63] Continuation of application No. 07/643,907, Jan. 18, 1991, abandoned.

[51] Int. Cl.$^7$ ............................................. H01L 21/8238
[52] U.S. Cl. ........................ 438/202; 438/203; 438/205; 257/370
[58] Field of Search .................. 437/59; 438/202, 438/203, 205; 275/370

[56] References Cited

U.S. PATENT DOCUMENTS

| | | |
|---|---|---|
| 4,157,269 | 6/1979 | Ning et al. . |
| 4,495,512 | 1/1985 | Isaac et al. .................................. 437/31 |
| 4,531,282 | 7/1985 | Sakai et al. . |
| 4,543,707 | 10/1985 | Ito et al. . |
| 4,581,319 | 4/1986 | Wieder et al. . |
| 4,640,721 | 2/1987 | Uehara et al. . |
| 4,641,416 | 2/1987 | Iranmanesh et al. . |
| 4,707,456 | 11/1987 | Thomas et al. . |
| 4,717,684 | 1/1988 | Katto et al. . |
| 4,717,686 | 1/1988 | Jacobs et al. . |
| 4,727,046 | 2/1988 | Tuntasood et al. . |
| 4,740,479 | 4/1988 | Neppl et al. . |
| 4,752,589 | 6/1988 | Schaber . |
| 4,753,898 | 6/1988 | Parrillo et al. . |

(List continued on next page.)

OTHER PUBLICATIONS

Mammen Thomas et al., EPO Bulletin 87/13, "Bipolar and/or MOS Devices Fabricated on Integrated Circuit Substrates", Mar. 25, 1987, pp. 2–12, Publ. No. 0 215 583.

Minoru Taguchi, EPO Bulletin 88/01, "Semiconductor Integrated Circuit," Jan. 7, 1988, pp. 2–11, Publ. No. 0 250 869.

Hans–Christian Schaber, Patentblatt 87/28, "Verfahren zum gleichzeitigen Herstellen vor, selbstjustierten bipolaren Transistoren und komplementaeren MOS–Transistoren auf einem gemeinsamen Siliziumsubstrat," Jul. 8, 1987, pp. 1–14, Publ. No. 0 227 970.

Russell C. Lange et al., EPO Bulletin 90/18, "Semiconductor Devices Having Closely Spaced Device Regions Formed Using a Self Aligning Reverse Image Fabrication Process", May 2, 1990, pp. 1–14, Publ. No. 0 366 587.

(List continued on next page.)

*Primary Examiner*—Wael Fahmy
*Assistant Examiner*—Long Pham
*Attorney, Agent, or Firm*—Whitham, Curtis & Whitham; Joseph P. Abate, Esq.

[57] ABSTRACT

An integrated circuit using high-performance bipolar and CMOS transistor elements on a single chip is fabricated by a simplified process requiring minimal, if any, changes in the process used for forming either type of device in accordance with a variety of possible device designs. The method according to the invention makes maximal use of self-aligned and self-masking processes to reduce the number of processing steps. The number of processing steps is further reduced by performing some steps concurrently on different device types. Further, the masking steps which are employed are reasonably misregistration tolerant, resulting in high manufacturing yield for the process. Consequently, the process according to the invention substantially eliminates the existence of trade-offs between element performance, integration density and process complexity and cost when plural technologies are integrated on the same chip.

19 Claims, 5 Drawing Sheets

U.S. PATENT DOCUMENTS

| | | |
|---|---|---|
| 4,757,026 | 7/1988 | Woo et al. . |
| 4,760,033 | 7/1988 | Mueller . |
| 4,764,482 | 8/1988 | Hsu . |
| 4,797,372 | 1/1989 | Verret et al. . |
| 4,891,328 | 1/1990 | Gris ............................................. 437/59 |
| 4,922,318 | 5/1990 | Thomas et al. ............................. 357/43 |
| 4,960,726 | 10/1990 | Lechaton et al. .......................... 437/59 |
| 4,987,089 | 1/1991 | Roberts ............................... 148/DIG. 9 |
| 4,988,632 | 1/1991 | Pfiester ................................ 148/DIG. 9 |
| 5,003,365 | 3/1991 | Havemann et al. ....................... 357/35 |
| 5,028,557 | 7/1991 | Tsai et al. ........................... 148/DIG. 9 |
| 5,100,815 | 3/1992 | Tsubone et al. ................... 148/DIG. 9 |

OTHER PUBLICATIONS

"Self–Aligned Bipolar Transistors for High–Performance and Low Power–Delay VLSI"; T.H. Ning et al.; IEEE Transactions on Electron Devices; vol. ED–28; No. 9; Sep. 1981.

"Fabrication of High Performance LDDFET's with Oxide Sidewall–Spacer Technology"; Paul J. Tsang et al.; IEEE Transactions on Electron Devices; vol. ED–29; No. 4; Apr. 1982.

HIGH PERFORMANCE/HIGH DENSITY BICMOS PROCESS

This is a continuation application of U.S. application Ser. No. 07/643,907, filed Jan. 18, 1991, now abandoned.

BACKGROUND OF THE INVENTION

1. Field of the Invention

The present invention generally relates to the manufacture of semiconductor devices and, more particularly, to the manufacture of semiconductor devices having both high-performance CMOS devices and high-performance bipolar devices integrated on a single chip at high density.

2. Description of the Prior Art

High density integrated circuits have been known and used for a number of years. Such devices have typically utilized single technologies through the chip on which they are integrated. In the course of this development, high density integration as well as designs for extremely high performance devices have been designed and manufactured. However, more recently, it has become desirable to use different technologies on the same chip in order to exploit particular performance characteristics of a particular technology which are unavailable in other technologies (e.g., high speed from bipolar devices and low power requirements from CMOS).

While there has been some success in achieving integrated circuit devices which combine several technologies such as CMOS circuits, including, as well, individual NMOS and PMOS transistors and other circuit elements, and bipolar transistors, the integrated circuits which have been realized have required trade-offs between complexity of manufacture, density of integration and performance of the individual circuits and transistors in the integrated circuit.

In particular, CMOS circuits formed by the LDD process as disclosed more fully in *Fabrication of High-Performance LDDFET's with Oxide Sidewall-Spacer Technology*, by Tsang et al, IEEE Transactions of Electron Devices, Vol. ED-29, No. 4, pp.590–596, April, 1982, (which is co-authored by two of the joint inventors of the present invention and hereby fully incorporated by reference) and bipolar transistors formed by the self-aligned polybase/polyemitter technology, disclosed more fully in *Self-Aligned Bipolar Transistors for High-Performance and Low-Power-Delay VLSI*, by T. H. Ning et al, IEEE Transactions on Electron Devices, Vol. ED-28, No. 9, September 1981, which is also hereby fully incorporated by reference, are extremely high-performance devices which have presented unusual difficulties in integration on a common chip without degrading performance of one or both types of devices. The CMOS process provides circuits with high performance structures such as lightly doped drain (LDD) formations and channel lengths of less than 1.0 $\mu$m and the self-aligned double poly bipolar transistors exhibit cut-off frequencies of about 20 GHz. Therefore it is particularly desirable that these devices be integrated on the same chip at high density while retaining all of the above performance characteristics. At the same time, it is important that the process by which such high density integration of these devices is achieved not render such integrated circuits economically unfeasible due to the complexity of the process and reduced manufacturing yields corresponding to such complexity. In this regard, prior art approaches such as that disclosed in Schaber, U.S. Pat. No. 4,752,589, provide process steps which "decouple" the formation of the CMOS transistors and the bipolar transistors and having a minimum number of process steps which are common to both the Bipolar and CMOS transistors. In Schaber, for example, evidently only a two layer gate electrode is formed concurrently with the emitter and collector zone of the bipolar transistor in order to decouple the phosphorus doping of the MOS gates and the arsenic doping of the polysilicon emitters; the process increasing the overall number of elements of the transistors which are formed and the overall number of process steps.

It has also been characteristic of the prior art, when integrated circuits utilizing plural technologies are manufactured, to manufacture each type of device in fairly complete sub-processes, thus separating the processes corresponding to each technology. Accordingly, while so-called self-aligned and self-masking techniques are known, for the purpose of reducing the number of necessary masks and processing steps and increasing manufacturing yields, such techniques have not been greatly utilized in forming integrated circuits comprising plural technologies. Further, known techniques for forming integrated circuits have not utilized processing steps common to both technologies for simultaneously forming portions of transistors and other elements in the different technologies. Similarly, prior integrated circuits utilizing plural technologies often form the devices of each technology at different levels within or above the substrate, complicating wiring and manufacturing processes necessary to complete such wiring.

SUMMARY OF THE INVENTION

It is therefore an object of the present invention to provide a manufacturing process which can be reliably carried out at high manufacturing yields which will preserve the performance of particular circuit element (e.g. transistor) designs.

It is another object of the invention to provide a manufacturing process which can provide high integration density of circuit elements according to different technologies.

It is a further object of the invention to provide a manufacturing process of minimized complexity and number of steps by which circuit elements according to different technologies can be integrated on the same chip.

It is a yet further object of the invention to provide a manufacturing process and an integrated circuit structure, produced thereby, in which circuit elements are produced at similar levels within and above the substrate to avoid complexity of wiring formation between devices on the chip.

It is another further object of the invention to provide a manufacturing process and an integrated circuit structure produced thereby in which all of the above objects of the invention can be simultaneously met.

In order to accomplish the above and other objects of the invention, a method for manufacturing an integrated circuit device including circuit elements formed according to both CMOS and bipolar technologies including the steps of simultaneously forming portions of circuit elements according to both the CMOS and the bipolar technologies, masking the circuit elements according to the bipolar technology and partially completing the circuit elements according to the CMOS technology, masking the circuit elements according to the CMOS technology and completing the circuit elements according to the bipolar technology, and completing the circuit elements according to the CMOS technology.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1B:
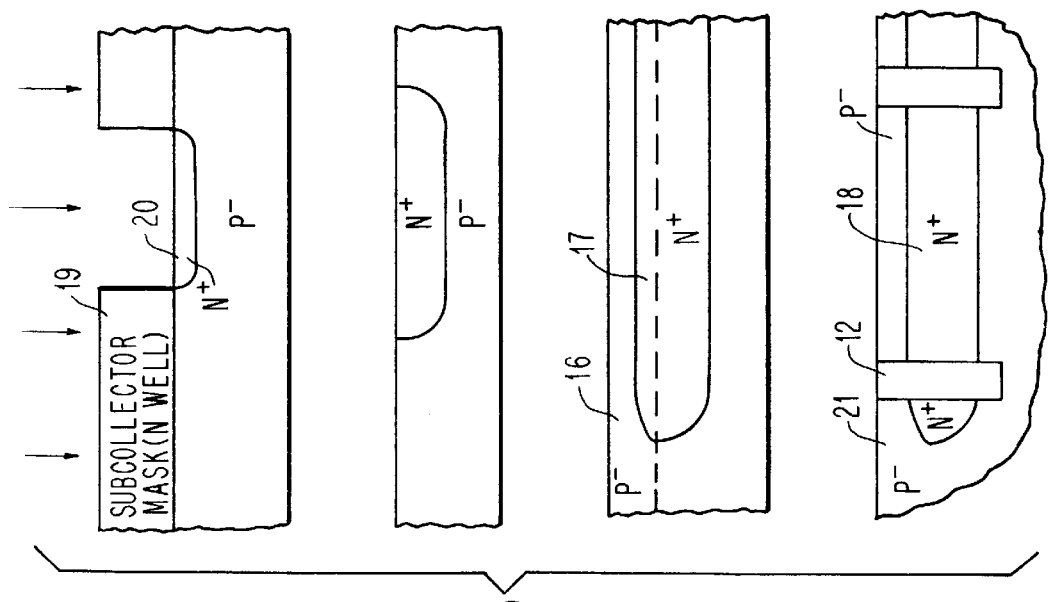
FIGS. 1a and 1b show different forms of sub-collector and trench isolation structures usable with the present invention.
Figure 1A:
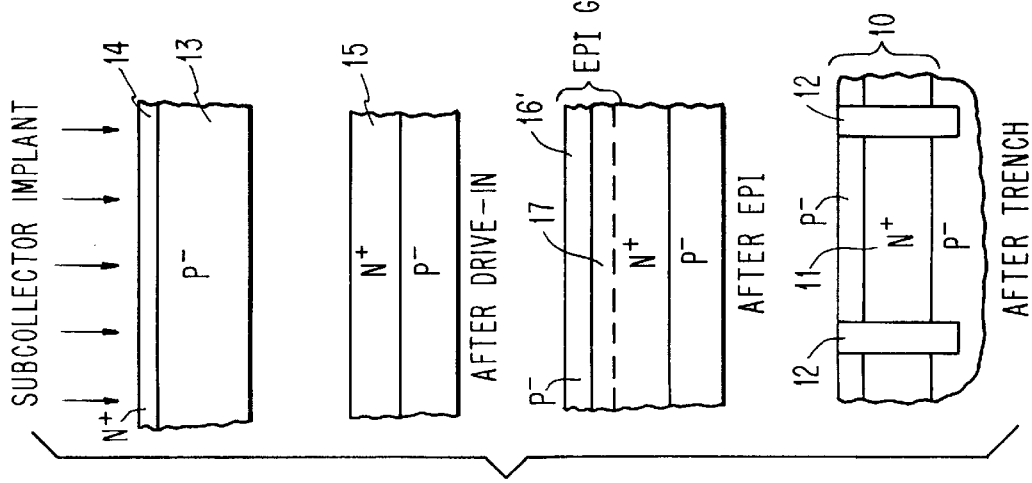

Referring now to the drawings, and more particularly to FIGS. 1a and 1b, there are shown two types of buried sub-collector structure useful with the invention and typical methods of formation of such structures. FIG. 1a particularly shows a blanket sub-collector which would typically be formed over the entirety of the chip. Trench structures 12, which are, per se, well-known for isolation of individual devices are also shown. If used only for isolation, these trench structures will be lined with an oxide and have a P+ isolation region at the bottom and a cap oxide at the top of each trench, although many different trench structures may be employed. In the preferred embodiment of the invention, at least some of the trench structures are used to make connections to the substrate of the integrated circuit although this could be done in other ways. Such a blanket sub-collector is typically formed in a P– substrate 13 by implanting an N+ impurity by any known implantation technique to form layer 14. This implanted impurity is then driven deeper into the substrate by heating or annealing which causes diffusion and, therefore, expansion of layer 14 to form layer 15. Subsequently another P– layer 16 is epitaxially grown. During this process, a fraction of the N+ impurity will diffuse into the epitaxially grown layer forming a portion 17 which serves to increase the depth of the sub-collector and a P– portion 16' which serves to bury the sub-collector within the body of the resulting substrate 10. After the formation of the blanket sub-collector, isolation trenches 12 can be formed by any conventional technique.

Optionally, if it is desired to have the sub-collector formed over less than all of the chip surface, the implantation of the N+ impurity can be patterned by the use of a mask 19 so that impurity implantation occurs only in region 20. In this case, driving in of the impurity increases both the lateral and depth dimension of the N+ region. As in the case of the blanket sub-collector, an epitaxial layer is then grown and, again, diffusion of the N+ impurity will occur, resulting in the approximate profile of region 17' shown. Isolation trenches can then be formed as desired.

It should be noted that the invention actually uses this sub-collector structure 18 only in regions where a bipolar circuit element is to be formed and other regions are unaffected by the existence of the sub-collector or portions 21 thereof which may exist beyond the position of the isolation trench. It should also be noted that the trench structure can also be used as a capacitive memory element, if desired, by inclusion of structure within the trench or at the boundaries thereof to enhance the capacitance thereof.

Figure 2:
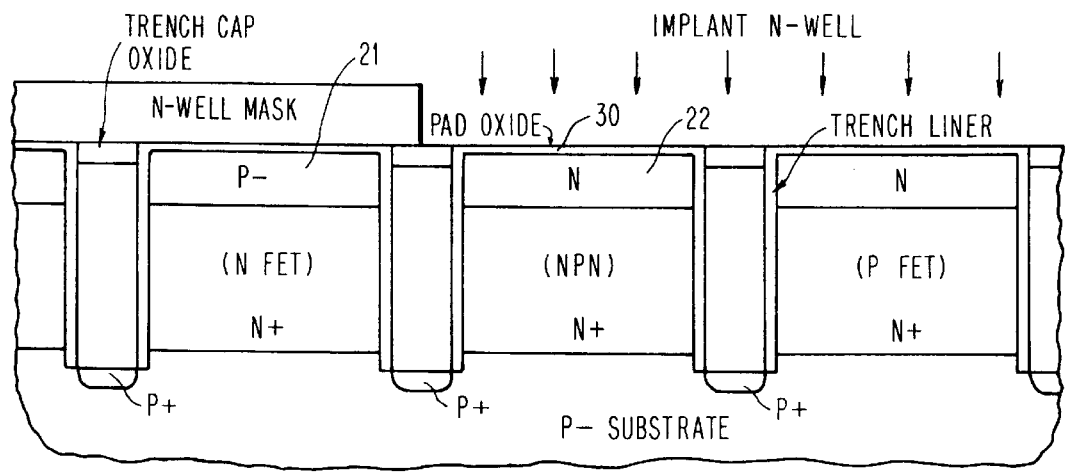
FIG. 2 illustrates adjacent areas allocated to three types of transistors and formation of an N-well in accordance with the invention for the blanket subcollector of FIG. 1a, FIG. 3 illustrates formation of N+ reach through regions common to both CMOS and bipolar technology devices.

FIG. 2 shows a portion of the substrate 10 as shown in FIG. 1a. It should be understood, however, that all process steps disclosed hereafter are equally applicable to the patterned subcollector structure shown in FIG. 1b. The left-hand portion, as shown, will be used for the formation of an NMOS device, the central portion for a bipolar device and the right-hand portion for a PMOS device. The order and proximity of these regions is not important to the structure or function of the invention and typically the pattern of regions will be repeated over at least a region of the chip and the apparent order will depend on the portion of the chip which is viewed. However, the order of these regions, as illustrated, will remain consistent throughout FIGS. 2–11.

In the manufacturing process step illustrated in FIG. 2, a mask is formed over the NMOS region and an N-type impurity is implanted into the P– layer, which originally extended over the entire region of the device including the sub-collector, to convert it into an N type layer in selected areas corresponding to both the bipolar and PMOS circuit elements. It is also possible, if desired, to perform the converse process, starting with an N-type epitaxial layer and forming P-wells. This step is important since the mask can be fairly coarse and alignment precision need not be greater than the transverse dimension of the isolation trench structures. Therefore this process is easily accomplished and is of extremely high yield. At the same time, threshold adjusting implantation can also be done. It should also be noted that this step forms part of the structure of circuit elements according to two different technologies and, relative to the prior art, takes the place of a separate step in each of the technologies; each of which would then require a higher degree of positioning accuracy.

Figure 3:
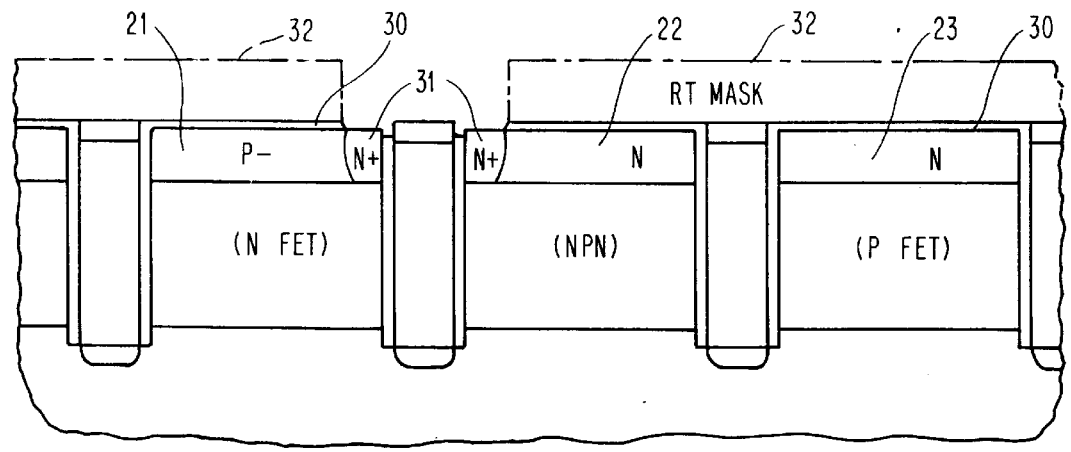

FIG. 3 shows removal of the mask used to form the N-well of FIG. 2 and the opening of oxide layer 30. This opening of the oxide layer allows the oxide layer to be used as a mask 32 for the thermal diffusion of the N+ impurities into areas 31 of both the P– region 21 and N region 22 to form reach-through contact regions. As is known, FET devices of MOS type construction require a bias voltage to be applied to the substrate in order to properly control the dimensions of the depletion region below the gates of the FET's. The PMOS transistor can have the bias voltage applied directly to the substrate since the substrate and region 23 are of the same conductivity type. However, the buried sub-collector interferes with the application of the bias voltage to the NMOS transistor if it is of the blanket type or otherwise extends under the entirety of the NMOS transistor. Therefore, the reach-through region 31 is provided to prevent undesireable potentials from developing in the NMOS substrate if a blanket sub-collector structure is used. If a patterned sub-collector structure is used, however, the reach through structure may be unnecessary.

Figure 4:
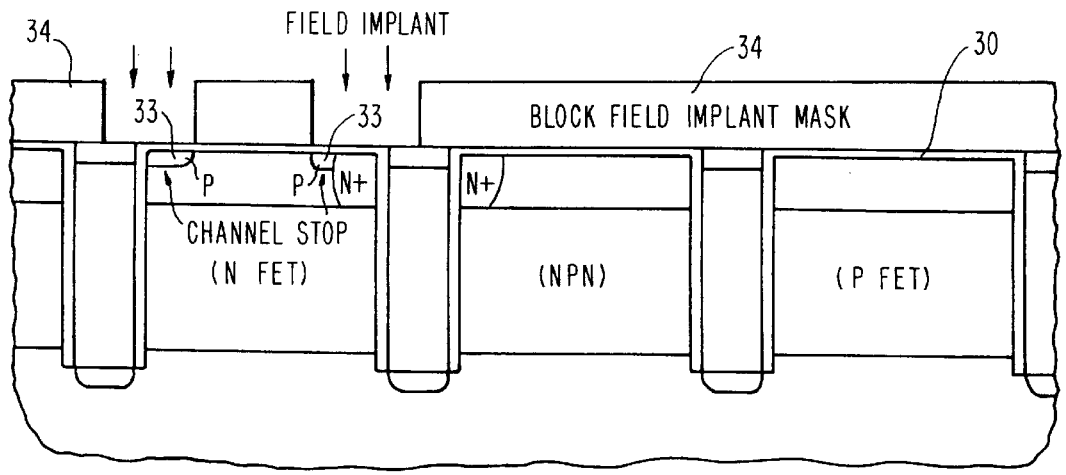
FIG. 4 illustrates a field implant with a mask to form P-type channel stop regions in the nFET of the CMOS transistor pair.

FIG. 4 shows the formation of a mask 34, referred to as a block field implant mask to control the implantation of a P-type impurity to form channel stop regions 33 in the nFET, if desired. As is known in the art, channel stop regions are used to carefully control the geometry of the FET channel to enhance the performance of the transistor, particularly to provide protection against parasitic leakage.

Figure 5:
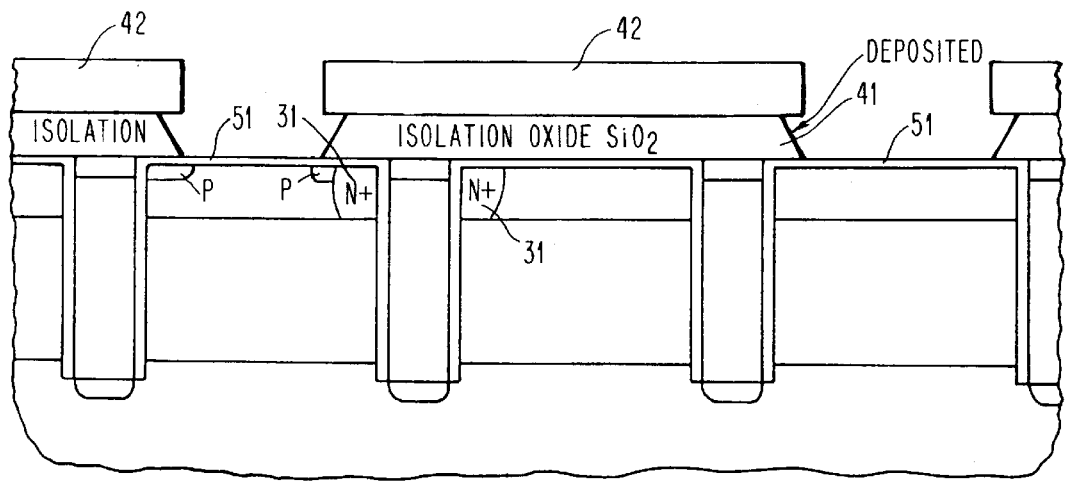
FIG. 5 illustrates formation of an oxide and etching of that oxide by means of a mask and formation of a gate oxide.

FIG. 5 shows the formation of an FET mask used to mask the bipolar areas of the chip. After diffusion of N+ areas 31, a thick protective layer of silicon dioxide is formed over the entire chip or at least the areas where the CMOS and bipolar transistors are formed. Then the bipolar transistor areas are masked with a mask which covers the trenches adjacent to the CMOS areas and N+ region 31. As with the preceding masking step, some misregistration is tolerable, resulting in high yields for this step, as well. All of the silicon dioxide layer is removed in selected areas by an isotropic etch to produce a slope of about 45° in the edges of layer 41. This could also be accomplished by performing local oxidation of silicon (LOCOS) over the trench. The slope is necessary to prevent poly Si rails (unwanted sidewalls) from remaining after the gate polysilicon is etched by reactive ion etching (RIE) using mask 42. The gate oxide 51, shown in FIG. 5, is then regrown to a desired thickness. It is desirable that the gate oxide be regrown since the geometry of the gate oxide can thus be more accurately controllable. It is also to be noted that the process of the invention allows complete freedom to choose any desired thickness for the gate oxide film for the CMOS transistors in order to control the resulting switching threshold thereof.

Figure 6:
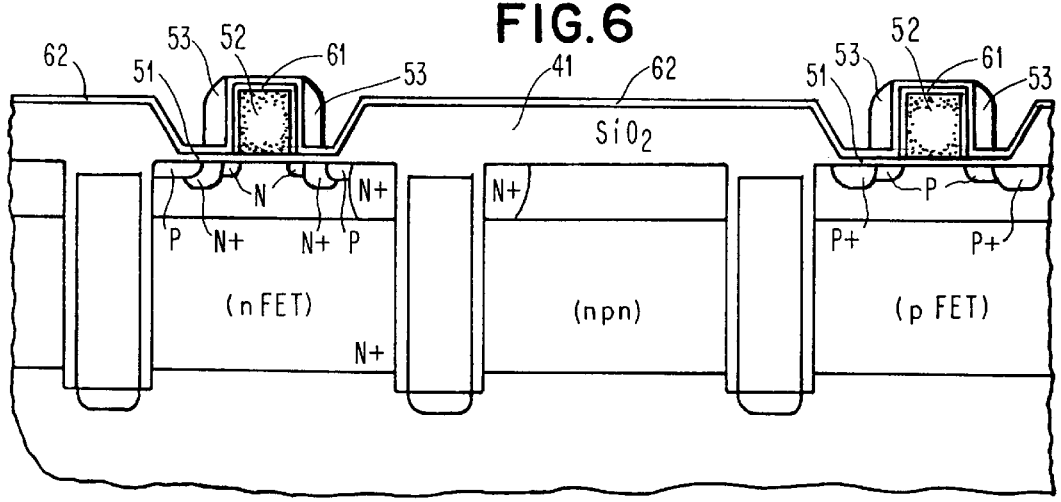
FIG. 6 illustrates formation of a protective nitride layer and a gate structure including oxide spacers as well as formation of the LDD structure in both NMOS and PMOS technologies.

As further shown in FIG. 6, after removal of mask 42, a polysilicon gate electrode 52 is formed on the gate oxide 51. After formation of the gate electrodes, a thin protective layer 61 of silicon dioxide is formed over the gate electrodes. A block out mask is then applied to mask all but the NMOS areas of the chip and N– impurity regions are implanted as a first step in the formation of the LDD structure of the NMOS transistor. This process is then repeated, with a block out mask applied to all but the PMOS areas.

After removal of the block out mask, a silicon nitride ($Si_3N_4$) layer 62 is deposited over the entire chip area, followed by a silicon dioxide layer which is then reactive ion etched to form sidewalls 53 on the polysilicon gate electrodes 52 of both NMOS and PMOS transistors. Then block out masks are again applied and additional impurities are implanted in the source and drain regions, respectively, as described above, using the sidewalls to control the reduced implantation areas of each of the NMOS and PMOS transistors, in turn.

Alternatively, these transistors can preferably be formed by a double implantation according to which a P type impurity such as boron is first implanted to a low concentration through the thin protective oxide and diffused to a desired depth in the substrate. Subsequently, an N type impurity is implanted through the oxide layer 61 to a somewhat lesser depth. As is known in the art, this forms a so-called lightly doped drain (LDD) structure which adjusts the fields within the substrate to increase the voltage which can be tolerated by the transistor without electron punch-through, thus increasing the operating margins of the transistor. However, the actual structure which is formed in the fabrication of the transistor is not important to the present invention. Since other areas are masked in this step of the process, any desired structure can be formed by any desired process.

Although not shown, the sequential formation of LDD structures in both NMOS and PMOS transistors may be performed simply by reversal of the masked areas so that the NMOS and bipolar areas are masked and the transistor formation steps are repeated. The conductivity types of dopants will also be reversed in the formation of the PMOS transistor. Therefore, the alternative formation of the CMOS transistor pair by the so-called double diffusion process described in the preceding paragraph allows a reduction in the number of masks which are required. It should also be noted that the particular structure formed for the PMOS transistor is independent of the particular structure formed for the NMOS transistor and vice-versa. The LDD structure may be omitted in either transistor or other changes made as may be deemed desirable.

It should also be noted that although the basic structure of the NMOS FET has been formed at this point, the transistor is not necessarily complete since other performance enhancing structures can be added to it later. Specifically, sidewall structures will be formed for self-aligned further implantation to complete and enhance the LDD structure of the transistor, as will be further discussed below in regard to FIG. 10. However, since the CMOS transistors will have similar appearing structures throughout the remainder of the process, a portion of the PMOS transistor will be omitted from the remainder of the drawings.

Figure 7:
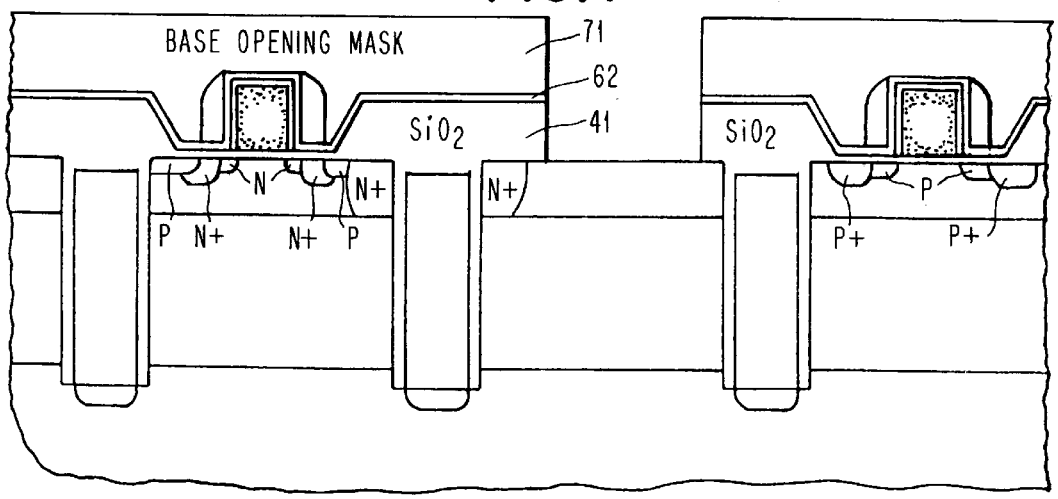
FIG. 7 illustrates formation of an oxide layer and base opening of the bipolar circuit element.
Figure 8:
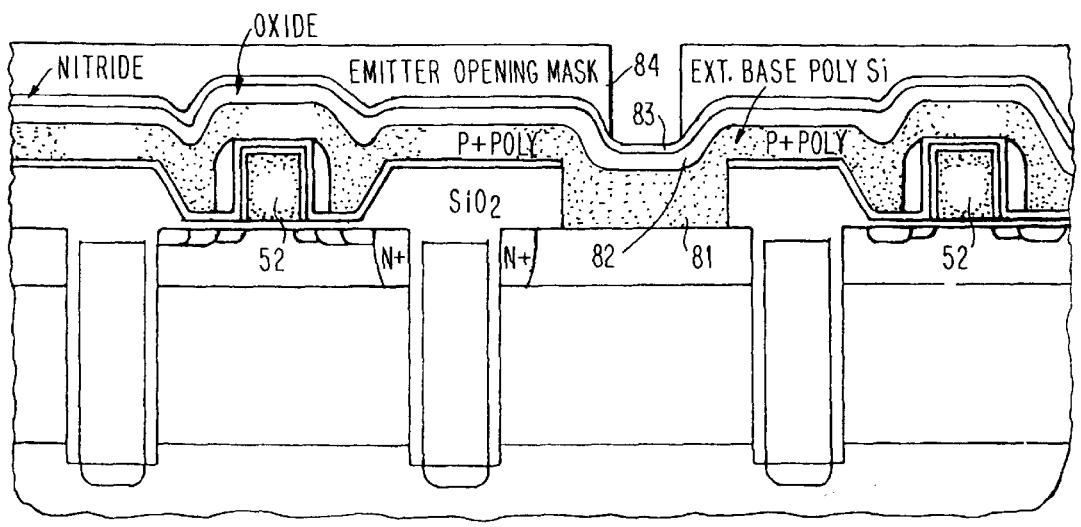
FIG. 8 illustrates formation of a P+ polysilicon layer, a tetra-ethyl orthosilicate (TEOS) layer, a nitride layer and the emitter opening mask.

Referring now to FIG. 7, once the PMOS transistor has been brought to a comparable degree of completion as the NMOS transistor, a mask is applied to the CMOS transistor regions. The thick silicon dioxide layer 41 is then removed, preferably by reactive ion etching, in the area where the bipolar transistor is to be formed. This step is referred to as base opening. Using this mask, a layer of P+ polysilicon 81 is deposited above the area which will form the base of the bipolar transistor, as shown in FIG. 8. This polysilicon layer is heavily doped and will serve as a diffusion source for formation of the extrinsic base region of the bipolar transistor. Layer 82 of tetra-ethyl orthosilicate (TEOS) and a silicon nitride layer 83 are then applied in sequence over the P+ polysilicon layer 81. Finally, an emitter opening mask 84 is applied over the silicon nitride layer.

Figure 9:
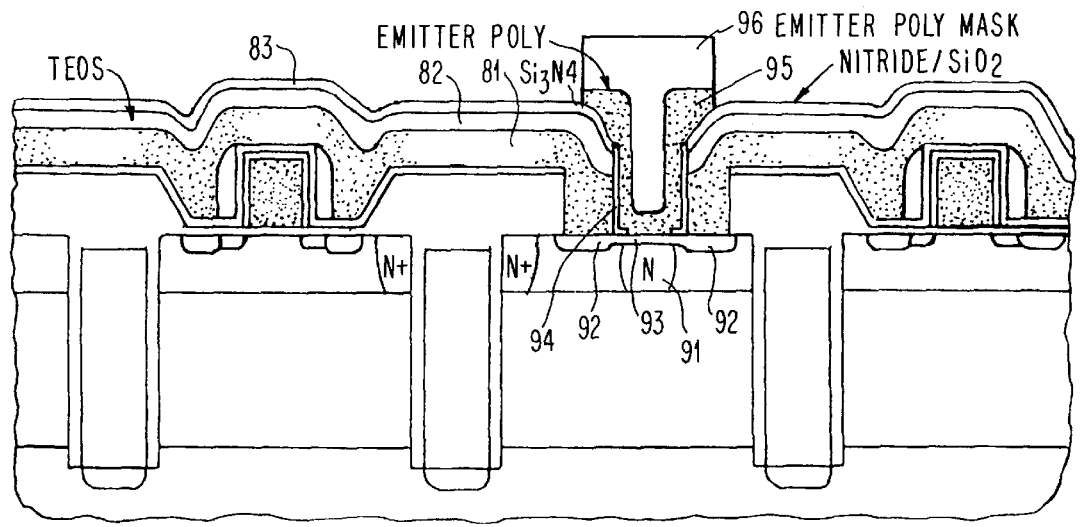
FIG. 9 illustrates base and emitter formation of the bipolar circuit element.
Figure 10:
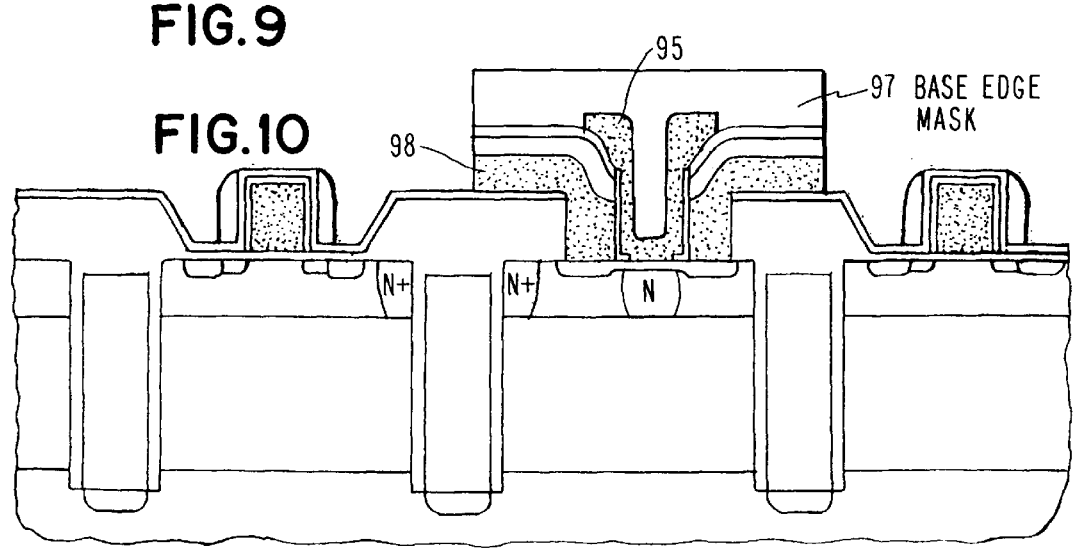
FIG. 10 illustrates an etching step to form a base edge for connection thereto.

Referring now to FIG. 9, the device is shown after formation of the collector and base of the bipolar transistor. This is done by reactive ion etching through all of layers 81–83. With the resist emitter opening mask still in place, an N-type impurity is implanted to form the collector of the bipolar transistor in a self-aligned operation. Since this operation is self-aligned, this masking step is also tolerant of misregistration. Following collector implantation, the mask is removed and the device is heat treated to form the extrinsic base region 92 by diffusion from highly doped TEOS layer 81. Then a P-type impurity is implanted above the collector by self-alignment with the base opening and the device is annealed to form the intrinsic base region 93 and silicon oxide sidewalls 94 on the exposed edges of the P+ polysilicon layer 81. Additional TEOS and silicon nitride layers 94 are preferably formed on the sidewalls of the bipolar transistor area at this time to form a spacer around the emitter opening to serve as isolation between the extrinsic base region and the emitter. This enhances the emitter-base breakdown voltage resistance of the bipolar transistor. Emitter polysilicon layer 95 is then deposited and arsenic is implanted and diffused to form the emitter region. Note that the emitter implantation step is done without a mask. Alternatively, if additional impurity implantation is desired in either of the CMOS devices, the layers 81–83 can be etched at this point and simultaneous implantations made in the bipolar and CMOS transistors. This further implantation at this time can also be used as alternative to one or more of the block out masking steps used in forming the LDD structures. Mask 96 is then applied and the emitter layer 95 is etched to define or limit the horizontal extent of the emitter region over the surface of the device. Similarly, as shown in FIG. 10, a base edge mask 97 is applied and etching done to define the limits of the base connection region 98, formed from layer 81, as shown in FIG. 8.

Figure 11:
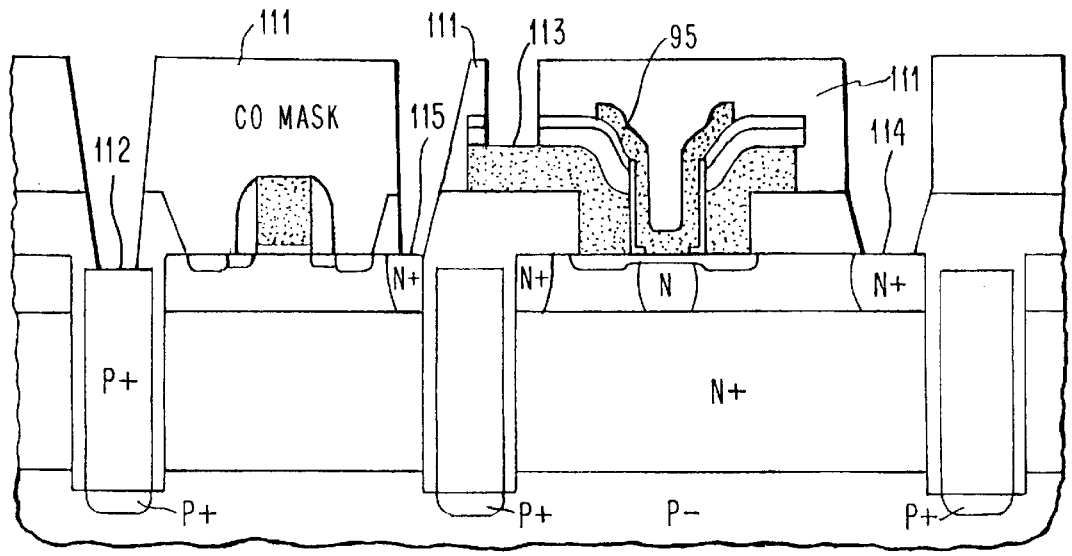
FIG. 11 illustrates formation of contact openings.
Figure 12:
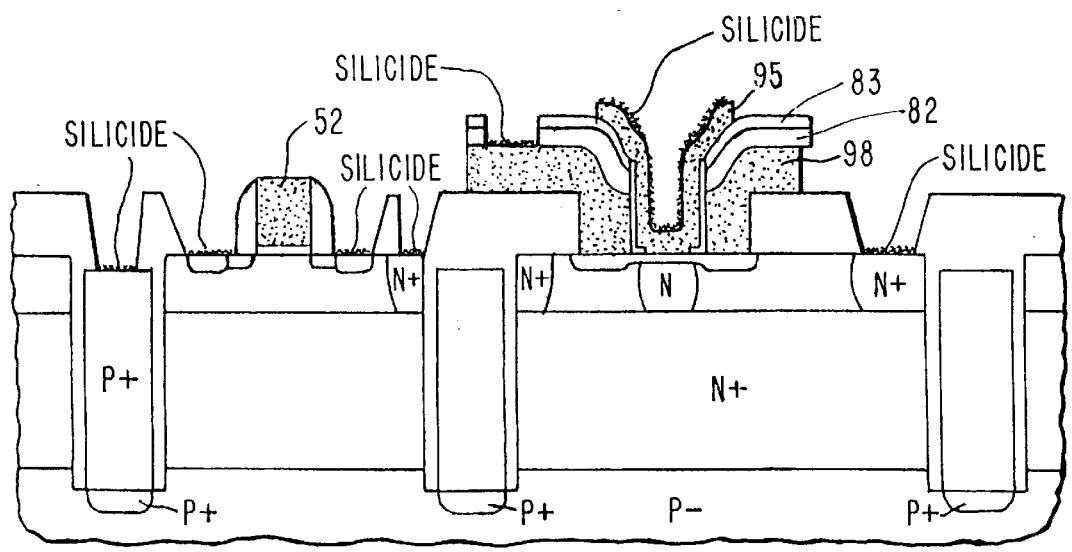
FIG. 12 illustrates silicide formation and the substantially completed device.

As shown in FIG. 11, a contact opening mask is applied and etching is done through the mask to respective surfaces of the isolation trenches 112, base connector layer 113 and collector reach through area 114 and NMOS reach through area 115. After removal of the contact opening mask, a metal silicide is applied to the opened contact areas and to the source gate and drain regions of the CMOS transistors to improve conductivity of these regions, as shown in FIG. 12. Note that, in this construction of the device, all contact regions are brought out at different locations above the substrate and at similar levels above the substrate which allows interconnections to be reliably formed in a well-known manner over a protective oxide (not shown) which is applied, along with metallization to form connections to the surface of the protective oxide.

It should be noted in the above-described process that only the emitter opening masking step requires a positional accuracy greater than the width of the isolation trenches since only entire circuit element areas are masked at any given time other than the emitter opening step. Therefore, manufacturing yields of the process according to the invention are extremely high. It should also be noted that the processing steps illustrated in FIGS. 1a, 1b, 2, 3, 8, 11 and 12 allow simultaneous processing to be performed on different circuit elements and, of these, FIGS. 1a, 1b, 2, 3, 11 and 12 allow simultaneous processing of circuit elements of different technologies, thus minimizing the overall number of processing steps. It is also important to note that the process according to the invention requires only minimal changes in processing, if any, for each of the bipolar and CMOS technologies involved and the design of the individual devices remains unchanged, thereby maintaining the high performance characteristics of both types of devices. In applying the principles of this invention to other transistor designs, it is anticipated that changes in processing or device formation will have a greater adverse effect on the performance of the bipolar devices than on CMOS devices. Therefore, it is important to note that the process according to the invention allows the entire bipolar transistor to be formed without change from the process used to form that device, alone, as shown in consecutive FIGS. 7–11, while some of those steps may be exploited to further form the CMOS devices.

Accordingly, it is seen that the above described process allows substantial freedom in the construction of individual circuit elements notwithstanding the different technologies exploited in their design. It is also seen that the process allows high-yield, economical construction of high performance devices according to many techniques, including but not limited to those device structures described above, without requiring design trade-offs in manufacturing complexity, integration density or individual device performance. It follows that the integrated circuit formed by the process according to the invention and including plural types of very high performance circuit elements will also potentially have extremely high performance, as well.

While the invention has been described in terms of a single preferred embodiment, those skilled in the art will recognize that the invention can be practiced with modification, particularly to accommodate other and variant bipolar and MOS processes and devices, within the spirit and scope of the appended claims.

What is claimed is:

1. A process for manufacturing an integrated circuit device including circuit elements formed according to both CMOS and self-aligned double poly bipolar technologies including the steps of
    a.) simultaneously forming portions of circuit elements according to both said CMOS and said self-aligned double poly bipolar technologies,
    b.) masking said circuit elements according to said self-aligned double poly bipolar technology and partially completing said circuit elements according to said CMOS technology,
    c.) subsequent to step b.), masking said circuit elements according to said CMOS technology and completing said circuit elements according to said self-aligned double poly bipolar technology, and
    d.) completing said circuit elements according to said CMOS technology.

2. A process for manufacturing an integrated circuit device including circuit elements formed according to both CMOS and self-aligned double poly bipolar technologies including the steps of
    a.) simultaneously forming portions of circuit elements according to both said CMOS and said self-aligned double poly bipolar technologies,
    b.) masking said circuit elements according to said self-aligned double poly bipolar technology and partially completing said circuit elements according to said CMOS technology,
    c.) subsequent to step b.), masking said circuit elements according to said CMOS technology and partially completing said circuit elements according to said self-aligned double poly bipolar technology,
    d.) simultaneously forming further portions of circuit elements according to both said CMOS and said self-aligned double poly bipolar technologies, and
    e.) completing said circuit elements according to said CMOS technology.

3. A process as recited in claim 2, wherein said step of masking said circuit elements according to said self-aligned double poly bipolar technology and partially completing said circuit elements according to said CMOS technology includes formation of a portion of a circuit element using a self-aligned process.

4. A process as recited in claim 2, wherein said step of masking said circuit elements according to said CMOS technology and partially completing said circuit elements according to said self-aligned double poly bipolar technology includes formation of a portion of a circuit element using a self-aligned process.

5. A process as recited in claim 2, wherein said step of simultaneously forming further portions of circuit elements according to both said CMOS and said self-aligned double poly bipolar technologies includes formation of a portion of a circuit element using a self-aligned process.

6. A process as recited in claim 1, including the further steps of forming source and drain regions of said circuit element formed according to said CMOS technology by
    implanting an impurity of a first conductivity type,
    diffusing said impurity of said first conductivity type,
    implanting an impurity of a second conductivity type, and
    diffusing said impurities of said first and second conductivity types.

7. A process as recited in claim 1, wherein said substrate includes isolation trench structures, further including the steps of masking all portions of a substrate other than areas between said isolation trench structures and an area of a substrate in which one of said circuit element formed according to said CMOS technology is to be formed, and forming channel stop regions though said mask by implantation of impurities of a conductivity opposite that of said substrate.

8. A process as recited in claim 1, further including the step of defining the extent of at least one of an emitter layer and a base layer from a continuous layer also forming at least one of an emitter and a base of said circuit element formed according to said self-aligned double poly bipolar technology including the further steps of applying a mask in the vicinity of said transistor and etching unmasked areas of said continuous layer.

9. A process as recited in claim 1, including the further step of implanting an impurity in a polysilicon layer forming a base region of each of a plurality of said devices formed according to said self-aligned double poly bipolar technology.

10. A process for manufacturing an integrated circuit device including circuit elements formed according to both CMOS and self-aligned double poly bipolar technologies including the steps of a.) simultaneously forming portions of circuit elements according to both said CMOS and said self-aligned double poly bipolar technologies, b.) masking said circuit elements according to said self-aligned double poly bipolar technology and partially completing said circuit elements according to said CMOS technology, c.) subsequent to step b.), masking said circuit elements according to said CMOS technology and completing said circuit elements according to said self-aligned double poly bipolar technology, d.) completing said circuit elements according to said CMOS technology, and e.) forming a base region of a circuit element formed according to said bipolar technology, said step of forming a base region including the steps of f.) forming a base connection region as a layer of highly doped semiconductor material contacting a substrate at a predetermined location, g.) forming an extrinsic base region by diffusing said impurity from said layer of highly doped semiconductor material into said predetermined region of said substrate, h.) implanting an impurity into an area of said substrate adjacent region predetermined area to form an intrinsic base, and i.) annealing said substrate to further diffuse said impurities until said intrinsic base contacts said extrinsic base.

11. A process as recited in claim 1, wherein said integrated circuit has some connections to said circuit elements thereon formed as exposed silicon surfaces, including the steps of masking selected areas of said integrated circuit, forming connection openings to expose other portions of silicon surfaces, removing said mask, and simultaneously forming a metal silicide on all exposed silicon surfaces.

12. A process for manufacturing an integrated circuit device including circuit elements formed according to both CMOS and bipolar technologies including the steps of simultaneously forming portions of circuit elements according to both said CMOS and said bipolar technologies, and completing said circuit elements according to said bipolar technology including the further steps of forming an aperture in a layer, said layer forming an impurity diffusion source for an extrinsic base of at least one circuit element according to said bipolar technology, forming an intrinsic base of said at least one circuit element within said aperture, forming a spacer on sidewalls of said aperture and forming an emitter of said at least one circuit element deposited within said spacer on said sidewalls of said aperture.

13. A method for forming an integrated circuit including both bipolar and CMOS circuit elements including the steps of substantially completing formation of said CMOS circuit elements and, subsequently, forming at least two layers including a polysilicon layer and an oxide layer over areas where both CMOS and bipolar circuit elements are to be formed, forming an aperture in said at least two layers in a portion of at least one of said areas where one of said bipolar circuit elements is to be formed, forming a portion of said bipolar circuit element in said aperture and removing said at least two layers in at least one area where at least one of said CMOS circuit elements is to be formed while preventing removal of said at least two layers in at least a portion of said area where one of said bipolar circuit elements is to be formed.

14. A method as recited in claim 13 including the further step of performing at least one impurity implantation step in said at least one area where at least one of said CMOS circuit elements is to be formed.

15. A method as recited in claim 13, wherein said polysilicon layer includes a highly doped polysilicon layer, said method including the further step of diffusing a fraction of impurities in said highly doped polysilicon layer into an adjacent layer.

16. A method as recited in claim 13, wherein said polysilicon layer further includes a highly doped polysilicon layer, and said at least two layers include a silicon nitride layer and a TEOS layer, said method including the further step of diffusing a fraction of impurities in said highly doped polysilicon layer into an adjacent layer.

17. A method as recited in claim 16, including the further step of depositing at least one of a TEOS layer and a silicon nitride layer in said aperture and in contact with respective ones of said TEOS layer and said silicon nitride layer.

18. A method as recited in claim 17, including the further step of forming a further portion of said bipolar circuit element between said at least one of a TEOS layer and a silicon nitride layer within said aperture.

19. A method as recited in claim 18, wherein said step of forming a further portion of said bipolar circuit element includes the further step of depositing a second highly doped polysilicon layer, said method including the further step of diffusing a portion of impurities in said second highly doped polysilicon layer into said adjacent layer.

* * * * *